United States Patent
Benschop et al.

(12) 
(10) Patent No.: US 6,597,431 B2
(45) Date of Patent: Jul. 22, 2003

(54) LITHOGRAPHIC PROJECTION APPARATUS AND DEVICE MANUFACTURING METHOD

(75) Inventors: Jozef Petrus Henricus Benschop, Veldhoven (NL); Oscar Fransiscus Jozephus Noordman, Eindhoven (NL); Michael Jozefa Mathijs Renkens, Geleen (NL); Erik Roelof Loopstra, Heeze (NL); Vadim Yevgenyevich Banine, Helmond (NL); Johannes Hubertus Josephina Moors, Helmond (NL); Antonius Johannes Josephus van Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/899,560

(22) Filed: Jul. 6, 2001

(65) Prior Publication Data

US 2002/0018194 A1 Feb. 14, 2002

(30) Foreign Application Priority Data

Jul. 10, 2000 (EP) ............................................ 00202457

(51) Int. Cl.[7] .......................... G03B 27/72; G03B 27/42
(52) U.S. Cl. ............................... 355/69; 355/53; 355/71
(58) Field of Search ....................... 355/53, 55, 67–71; 356/399–401; 250/492.2, 492.22

(56) References Cited

U.S. PATENT DOCUMENTS

| 4,604,562 | A | * | 8/1986 | Phillips et al. | ............... 318/640 |
| 5,677,754 | A | * | 10/1997 | Makinouchi | ................... 355/53 |
| 5,939,725 | A | * | 8/1999 | Muraki | .................... 250/492.22 |
| 5,995,198 | A | * | 11/1999 | Mizutani | ..................... 355/53 |
| 6,160,619 | A | * | 12/2000 | Magome | ..................... 356/358 |
| 6,222,615 | B1 | * | 4/2001 | Suzuki | ......................... 355/68 |

FOREIGN PATENT DOCUMENTS

JP 02000182955 A * 6/2000

* cited by examiner

Primary Examiner—Henry Hung Nguyen
(74) Attorney, Agent, or Firm—Pillsbury Winthrop LLP

(57) ABSTRACT

A lithographic projection apparatus includes a radiation system for supplying a projection beam of radiation having a propagation direction, a support structure for supporting patterning structure, the patterning structure serving to pattern the projection beam according to a desired pattern, a substrate table for holding a substrate and a projection system for projecting the patterned beam onto a target portion of the substrate, wherein the lithographic projection apparatus further includes a sensor for measuring a movement of the projection beam perpendicular to its propagation direction and a controller to control a received dose of the projection beam on a target portion of the substrate in response to an output from the sensor.

16 Claims, 3 Drawing Sheets

LITHOGRAPHIC PROJECTION APPARATUS AND DEVICE MANUFACTURING METHOD

BACKGROUND OF THE INVENTION

1. Field of the Invention

The present invention relates generally to a lithographic projection apparatus and more particularly to a lithographic projection apparatus including received dose control.

2. Background of the Related Art

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic structure. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

During exposure, the radiation system supplies a projection beam of radiation to irradiate a portion of the mask (or other patterning structure) and the projection system images the irradiated portion of the mask onto a target portion of the substrate. It is important that the total plane of the mask is irradiated with an equal dose. Variations in the intensity of the projection beam over the plane of the mask will cause a variation in the dose and hence a variation in the quality of the imaged target portions on the substrate. Variations in the intensity cause the critical dimension (i.e. the line width of the imaged lines) to vary, which is not wanted. Substrates having such a variation of the critical dimension may be rejected during a quality control in the manufacturing process. If the intensity of irradiation is higher than a nominal intensity at a certain portion of the mask, the critical dimension of the images projected from that portion will be smaller than when the nominal intensity is used at that portion.

SUMMARY OF THE INVENTION

One aspect of the invention provides an apparatus with a very low intensity variation over the plane of the mask (or other patterning structure). Accordingly, the present invention provides an apparatus including sensor constructed and arranged to measure a movement of the projection beam substantially perpendicular to its propagation direction and a dose controller constructed and arranged to control a received dose of said projection beam on a target portion of the substrate in response to an output from said sensor. The received dose is defined as the integral of the received intensities on a target portion of the substrate.

It has been determined by the inventors that one cause of variations of the intensity of irradiation of the mask is a movement of the projection beam perpendicular to its propagation direction. This movement may be caused by the radiation system mechanically moving with respect to the projection system or the source of the projection beam moving with respect to the projection system. The latter can, for example, be the case if a plasma source is used. The plasma that radiates the projection beam can be moving perpendicular to its propagation direction. The movements of the plasma will be projected through the radiation system of the lithographic apparatus and will cause the projection beam to move with respect to the projection system.

The invention can be advantageously used in a lithographic projection apparatus wherein said support structure is movable in a scanning direction that is substantially perpendicular to the propagation direction, and said sensor is adapted to measure movements of said projection beam in a direction corresponding to said scanning direction.

A lithographic projection apparatus as described in the previous paragraph can be very sensitive to movements in said scanning direction because the relative movement of the projection beam with respect to the mask (or other patterning structure) is determined by the movement of the mask plus the movement of the projection beam. The relative movement of the projection beam with respect to the mask will determine the intensity of irradiation on a portion of the mask. If for example, the mask moves in the same direction as the projection beam the relative movement of that beam with respect to the mask will be low and consequently the intensity of the irradiation higher on that portion of the mask. If, the other way around, the projection beam moves in the opposite direction to the mask the relative movement will be high and the intensity of the irradiation lower on that portion of the mask. The control structure may be adapted to control the movements of said support structure and said substrate table in the scanning direction, because by adjusting the speed of the mask and the substrate table the received dose of said projection beam on a target portion of said substrate can be controlled.

Control structure can be connected to the said sensor and to adjustment structure for adjusting the intensity of the projection beam in response to an adjustment signal from said control structure. The control structure can calculate an adjusted radiation intensity in response to information of the sensor about the movement of the projection beam with respect to the projection system. This adjusted radiation intensity (e.g. adjustment signal) will be sent to a source of the projection beam, which subsequently adjusts the intensity of that beam. If the projection beam is pulsed (e.g. the source radiates in pulses) said control structure can adjust the repetition rate or frequency of the pulses to adjust the intensity of that beam. Alternatively, said control structure may be constructed and arranged to adjust the energy per pulse.

If mechanical movements between the radiation system and the projection system cause the movements of the projection beam, the sensor may be adapted to measure mechanical movements. It may be advantageous to use acceleration sensor for such measurements. A direct mechanical connection between the radiation system and the projection system for the sensor may be avoided in this way.

If a movement of the source of the projection beam causes the movements of the projection beam the sensor may comprise intensity sensor for measuring the intensity of that beam. This can be done by using two or more light intensity measuring sensors, which are located at a fixed place in the projection beam and are used for a differential measurement. If the light intensity at a first sensor is increasing relative to the light intensity received by a second sensor the projection beam will be moving in the direction of the first sensor.

The sensor can be connected to a source sensor and said source sensor can measure movements of the source of said projection beam with respect to a reference point. The source sensor can be placed nearby the source (e.g. a plasma) and the results of the source sensor can be processed in the control structure such that the movements of the projection beam with respect to the projection system can be calculated.

In the case of a pulsed source, the sensor will give a measurement signal when the source of the projection beam emits a pulse. The position of the projection beam during each pulse will be measured and a future position of the projection beam with respect to the projection system can be determined by the control structure, if said movement is an oscillating movement. For this purpose the control structure may be provided with calculating structure for calculating a future position of said projection beam. When the oscillating movement is known and the calculating structure can calculate a future position the control structure can predict the position of the projection beam for a subsequent pulse. The said subsequent pulse will be triggered at a moment when the projection beam is at a required position with respect to the projection system. For the first pulses irradiated by the source the oscillation movement will not be known and therefore these pulses will be positioned randomly. To alleviate a possible non-uniformity in the intensity caused by the first pulses, a data storage device connected to said sensor and said control structure can be used. The data storage device will store information about the intensity and position of the projection beam during the randomly radiated first pulses. When the oscillating movement is known, for example after the first five pulses are radiated, this data can be used to trigger the next pulses for the projection beam such that any intensity variation during the first pulses is compensated during the following pulses.

According to a further aspect of the invention there is provided a device manufacturing method including providing a substrate that is at least partially covered by a layer of radiation-sensitive material, providing a projection beam of radiation, having a propagation direction, using a radiation system, using patterning structure to endow the projection beam with a pattern in its cross-section, projecting the patterned beam of radiation onto a target portion of the layer of radiation-sensitive material, wherein movements of the projection beam substantially perpendicular to its propagation direction are measured by sensor which are connected to control structure for adjusting the intensity of said projection beam in response to an output from said sensor.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

The invention and its attendant advantages will be further elucidated with the aid of exemplary embodiments and the accompanying schematic drawings, whereby.

DETAILED DESCRIPTION

Embodiment 1

Figure 1:
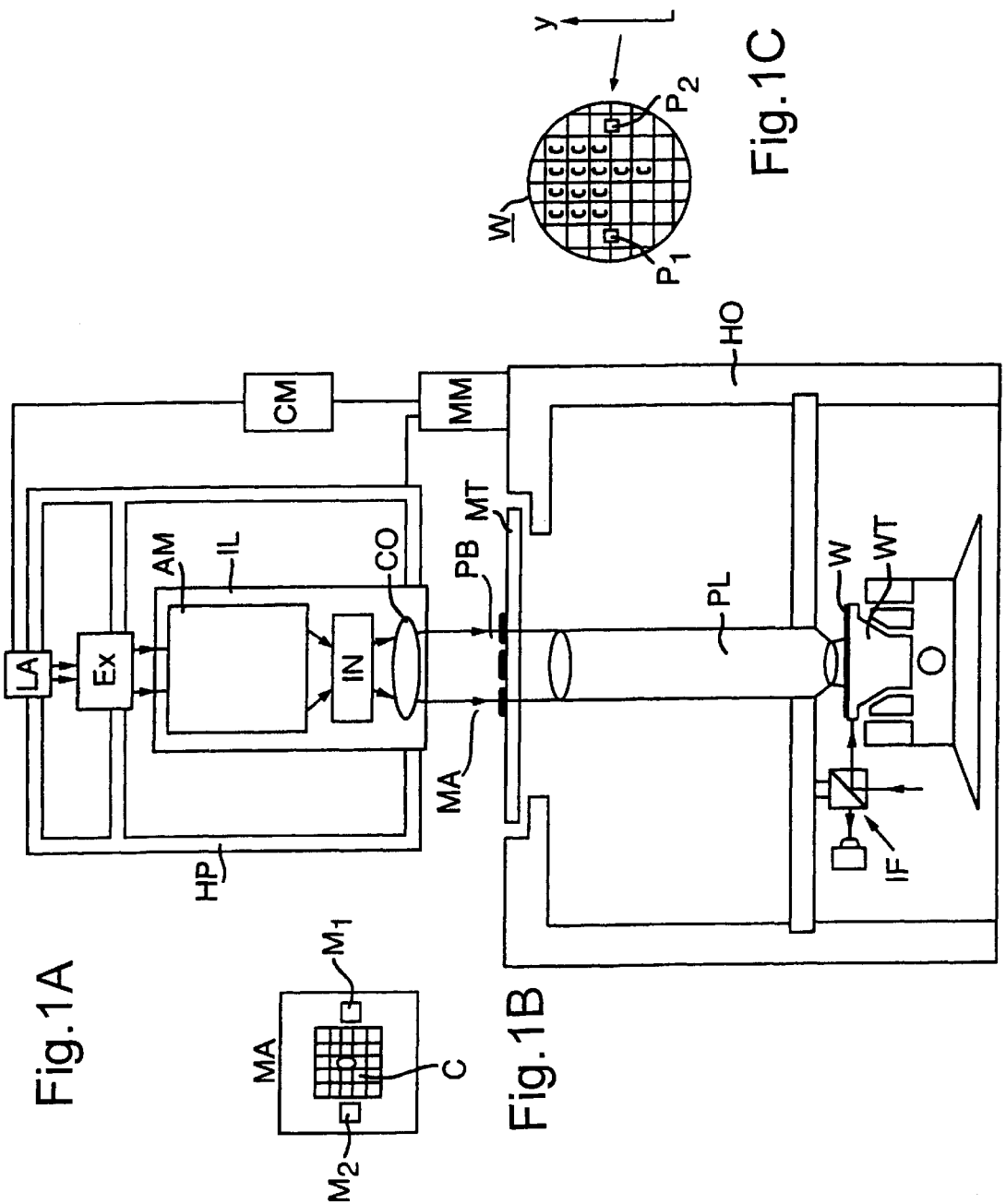
FIG. 1A depicts a lithographic projection apparatus according to the invention.
FIG. 1B depicts a mask of the lithographic projection apparatus shown in FIG. 1A.
FIG. 1C depicts a substrate of the lithographic porjection apparatus shown in FIG. 1A.

FIG. 1A schematically depicts a lithographic projection apparatus according to a particular embodiment of the invention. The apparatus includes a radiation system Ex, IL, for supplying a projection beam PB of radiation (e.g. UV radiation with a wavelength of 365 nm, 248 nm, 193 nm or 157 nm, or EUV radiation, X rays, electrons or ions). In this particular case, the radiation system also comprises a radiation source LA, and the radiation system as well as the source LA are rigidly fixed to a support frame HP. The apparatus further includes a first object table (mask table) MT provided with a mask holder for holding a mask MA (e.g. a reticle), and connected to first positioning structure for accurately positioning the mask with respect to item PL. It likewise includes a second object table (substrate table) WT provided with a substrate holder for holding a substrate W (e.g. a resist-coated silicon wafer), and connected to second positioning structure for accurately positioning the substrate with respect to item PL. The mask MA is shown in greater detail in FIG. 1B. Also included is a projection system ("lens") PL (e.g. a lens or catadioptric system, or a mirror group) for imaging an irradiated portion of the mask MA onto a target portion C (e.g. comprising one or more dies) of the substrate W, and rigidly fixed to a support frame HO. The substrate W is shown in greater detail in FIG. 1C.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a Hg lamp or excimer laser, a laser-induced plasma or discharge plasma source, or a wiggler/undulator situated around the path of an electron beam in a storage ring or synchrotron) produces a beam of radiation. This beam is fed into an illumination system (illuminator) IL, either directly or after having traversed conditioning structure, such as a beam expander Ex, for example. The illuminator IL may comprise adjusting structure AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1A that the source LA may be within the housing of the lithographic projection apparatus (as is often the case when the source LA is a mercury lamp, or for example a laser-produced plasma source), but that it may also be remote from the lithographic projection apparatus and separated from the support frame HP, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning structure (and interferometric sensor IF), the substrate table WT can be moved accurately, e.g. so as to position different target portions C (FIGS. 1B and 1C) in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1A. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

According to the invention sensor MM are used for measuring movements of the projection beam PB with respect to the projection system PL. If these movements are caused by mechanical movements of the source LA and the radiation system Ex, IL with respect to the projection system PL (due to, for instance, a movement of the support frame HP), these movements can be measured by measuring the movements of the support frame HP with respect to the support frame HO with sensor MM (e.g. interferometers, capacitive sensors, optical sensors or pneumatic sensors). Alternatively, one could use sensor for measuring the acceleration of the frame HP with respect to the projection system PL.

A time dependent relative movement Mr (t) of the mask with respect to the projection beam PB in a step-and-scan apparatus is given by:

$$Mr(t) = Mm(t) - Mpb(t),$$

in which it is assumed that if the movement of the projection beam Mpb (t) and of the mask Mm (t) are in the same direction, the movement of the projection beam Mpb (t) gets a plus sign and when it is in the opposite direction it gets a minus sign. The movement of the mask Mm (t) has a predetermined value and the movement of the projection beam Mpb (t) is measured by the sensor MM connected to a control structure CM. Both movements are measured with respect to the projection system PL.

The lithographic projection apparatus according to the first embodiment comprises a pulsed source LA. Control structure CM can calculate an adjustment of the repetition rate of the pulsed source LA to adjust the intensity of the projection beam PB in response to a calculated relative movement, by the following equation:

$$fl(t) = fln \times [Mr(t)/Mm(t)],$$

$$= fln \times [1 - Mpb(t)/Mm(t)],$$

in which fl (t) is the repetition rate of the source LA as controlled by the control structure CM and fln is the nominal repetition rate of the source LA (e.g. a laser). If one would like to adjust the time interval Δt between the pulses in response to a measured movement Mpb of the projection beam PB with respect to the projection system PL the following equation can be used:

$$\Delta t(t) = \Delta t0 \times [1 + Mpb(t)/Mm(t)],$$

in which Δt (t) is the time between the pulse of the source at time t and the next pulse of the source, and Δt0=1/fln. In this equation it is assumed that the movement of the projection beam PB does not change very much between the pulses i.e. that fln is much larger than the frequency of an oscillating movement of the projection beam PB with respect to the projection system PL.

Another possibility for adjusting the radiated intensity of the projection beam PB is adjustment of the energy per pulse by the control structure CM in response to an measurement signal from the measurement structure MM. The following equation shows how the energy per pulse can be adjusted to compensate for a movement of the projection beam PB:

$$E1(t) = Eln \times [1 - Mpb(t)/Mm(t)],$$

wherein El (t) is the energy per pulse at time (t) and Eln is the nominal laser energy per pulse.

Embodiment 2

Figure 2:
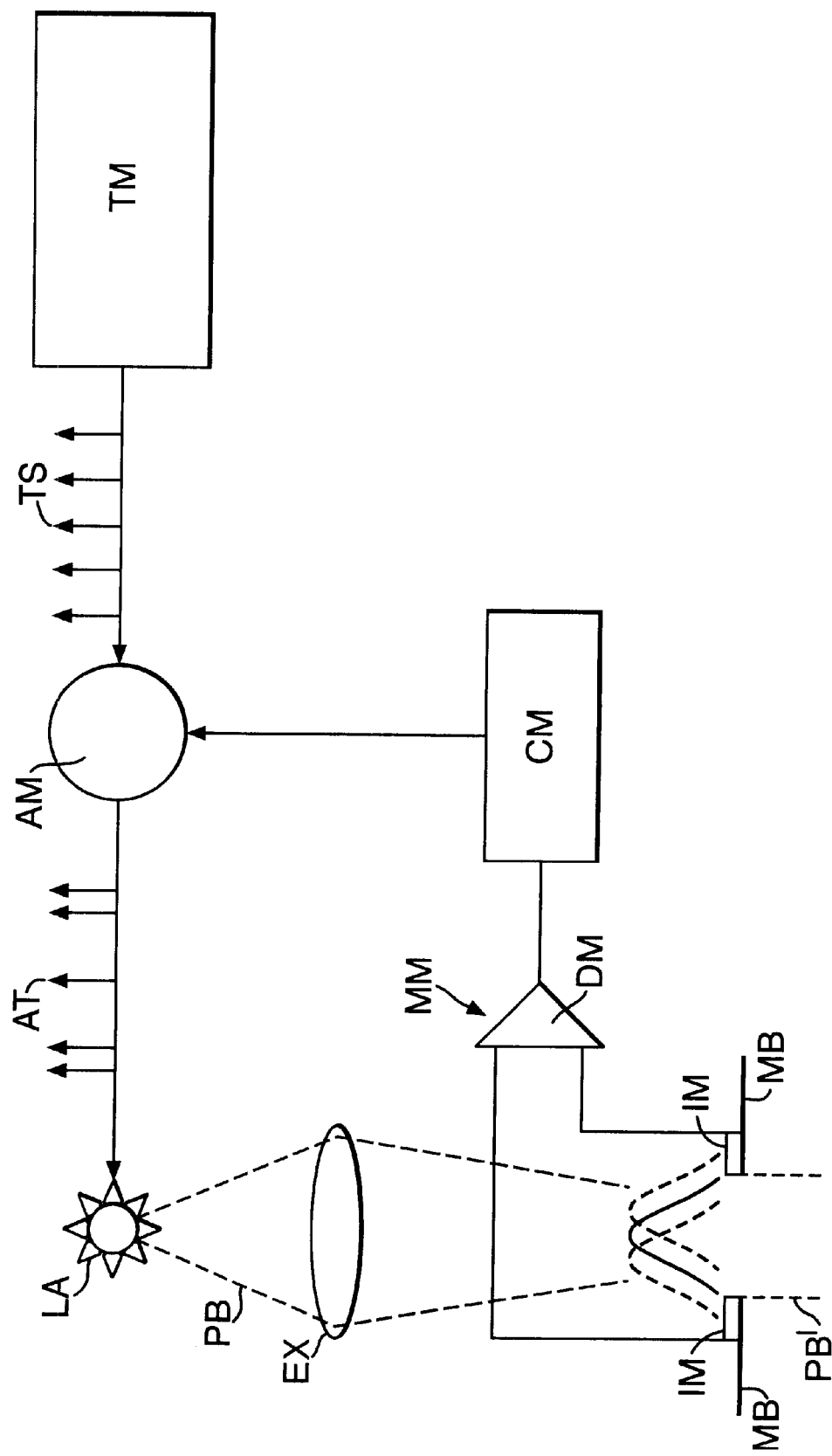
FIG. 2 depicts a radiation system for use in a lithographic projection apparatus according to the invention.

FIG. 2 depicts a radiation system according to a second embodiment of the invention, which radiation system can be used in a lithographic apparatus according to embodiment 1. The radiation system includes a pulsed source of radiation LA which produces a projection beam of radiation PB such as UV radiation (e.g. with a wavelength of 365 nm, 248 nm, 193 nm, or 157 nm), or EUV radiation; beam shaping optics EX for forming a projection beam PB' with a required intensity and direction; masking structure MB for defining the form of the projection beam PB'; sensor MM, comprising a pair of intensity measuring sensors IM and comparison structure DM; control structure CM; and pulse adjustment structure AM for adjusting the pulse triggering signal TS from the pulse triggering structure TM.

The source LA can be located away from the lithographic projection apparatus for safety or contamination reasons and the projection beam PB can be supplied to the apparatus through a light guide. The projection beam PB will traverse the beam shaping optics EX to the masking structure MB which can partly obscure the beam PB so as to have, at the area of a (non-depicted) mask (or other patterning structure), a rectangular cross-section of that beam PB. Subsequently the projection beam PB' which has a required form and direction will be projected upon the mask.

The sensor MM can be used to measure a movement of the projection beam PB with respect to the masking structure MB. The intensity measuring sensors IM will give an intensity signal in response to the received radiation from the source LA, and the comparison structure DM will compare the intensity signals from both intensity measuring sensors IM with each other, such that a movement of the projection beam PB with respect to the masking structure MB can be determined. For example, if the projection beam PB moves toward one of the two intensity measuring sensors IM (e.g. comprising CCD arrays, photodiodes or photomultipliers) the comparison structure DM will notice an increase in the measured intensity at the said one intensity measuring sensor IM and a decrease in the measured intensity at the other intensity measuring sensor IM. The comparison structure DM can determine the position and the movement of the projection beam PB with respect to the masking structure MB, and give a signal corresponding to said position and movement to the control structure CM. The control structure CM can calculate an adjusted radiation intensity and can send a signal to the adjustment structure AM to adjust the pulses TS, which come from the pulse trigger structure TM, into adjusted pulses AT. The pulses AT trigger a pulse of radiation from the source LA to form projection beam PB.

If a pulsed source LA is used, the control structure CM will only get a measurement signal from the sensor MM when the source LA radiates a pulse; between those pulses no movement or position can be measured because there is no radiation on the intensity measuring sensors IM. However, it can often be expected that the movement of the projection beam PB will be an oscillating movement, such that after the initial pulses the oscillation of that beam PB can be determined and future positions of that beam PB can be calculated. The control structure CM can calculate a future position of the projection beam PB and can adjust the pulses TS such that the mask is irradiated with a uniform intensity. Information describing the non-uniform intensity caused by the first irradiated pulses (i.e. the pulses necessary to determine the oscillation) can be stored in a data storage device by storing data with regard to the intensity and the position of the projection beam PB per pulse. The data storage device is connected to the sensor MM and the control structure CM. Later on, when the oscillation is determined, the data can be retrieved from the data storage device and can be used by the control structure CM to calculate an adjusted timing of the pulses for the adjustment structure AM, such that subsequent pulses can compensate for non-uniformity caused by the first irradiated pulses.

Embodiment 3

In a third embodiment according to the invention, the sensor (e.g. the sensor MM in FIG. 2) may comprise source sensor located near the source of radiation LA to measure movements of that source LA. The data from the source sensor MM need to be converted to data for movement of the projection beam PB by a calculating device, which may be comprised by control structure CM. The control structure CM can calculate an adjusted radiation intensity in response to a measurement signal from the sensor MM and can send a signal to the adjustment structure AM to adjust the pulses TS, which come from the pulse trigger structure TM, into adjusted pulses AT. The latter can be done similar to the methods described in embodiment 1 and 2. It must be understood that when the sensor MM comprises a source sensor as described above, the intensity measuring sensors IM and the comparison structure DM of embodiment 2 may be left out of the embodiment.

Embodiment 4

Figure 3:
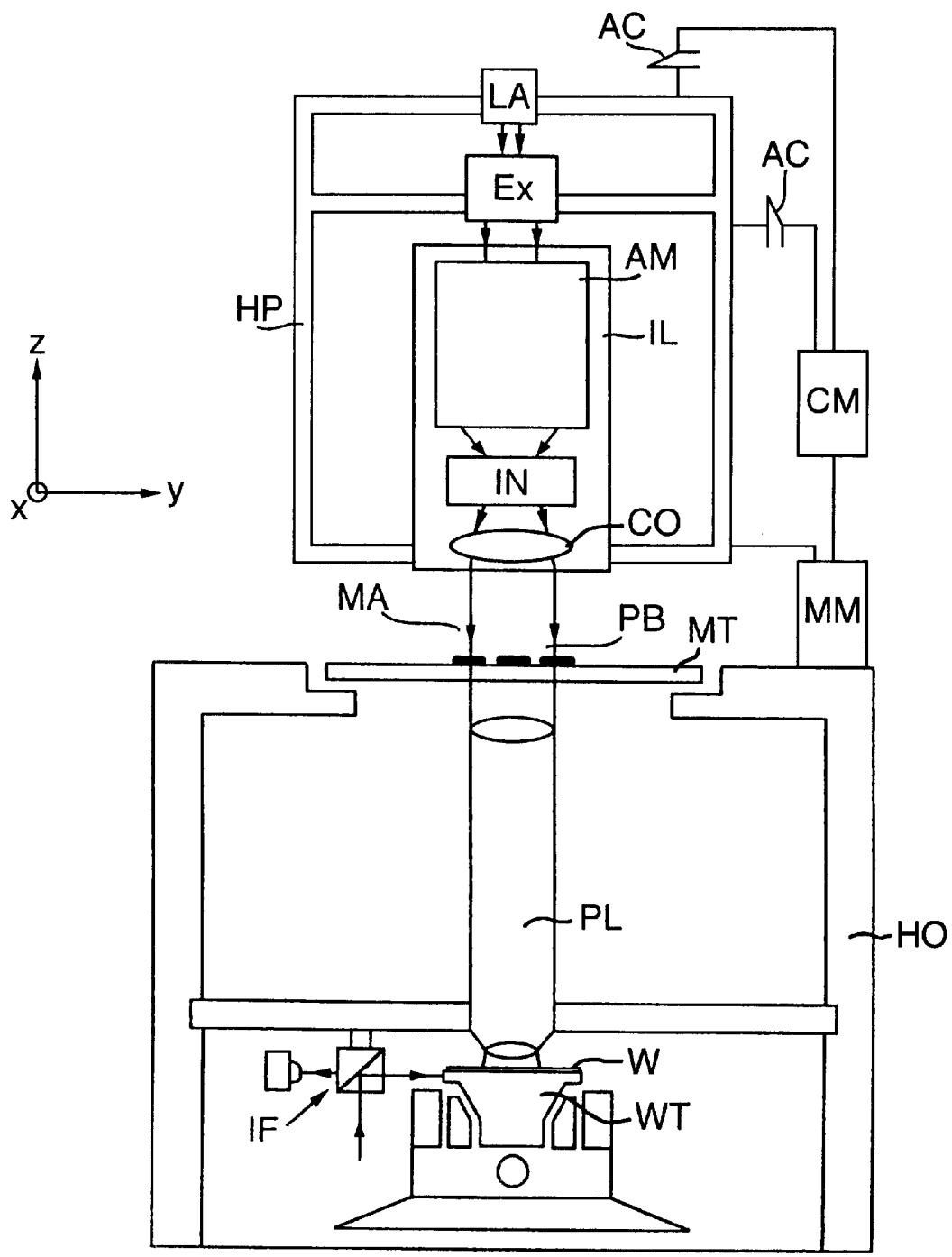
FIG. 3 depicts a lithographic projection apparatus according to the invention, where the control structure comprise actuators for adjusting the position of a support frame for holding the radiation system and a source for providing a projection beam.

In a fourth embodiment according to the invention, which is illustrated in FIG. 3 and which may be the same as the first embodiment save as described below, actuators AC are introduced to provide position adjustments of the frame HP with respect to the frame HO. The control structure CM are adapted to control the actuators AC. Said position adjustments comprise at least adjustments in a direction substantially perpendicular to the direction of propagation of the projection beam PB. Generally, the frame HO is supported by airmounts to alleviate the effect of, for instance, vibrations of a floor supporting the lithographic projection apparatus. In this embodiment the frame HP is, just as the frame HO, supported by airmounts (not shown in FIG. 3) and the actuators AC may be, for instance, airmount actuators. A movement of the frame HO will in principle cause a movement of the frame HP relative to the frame HO. Such a movement will, in principle, cause a movement of the projection beam PB with respect to the projection system PL, and as explained above this may lead to exposure dose variations. The control structure CM are, in this embodiment, adapted to provide signals to the actuators AC such that the frame HP substantially follows the movement of the frame HO. In principle the position of the projection beam PB with respect to the projection system PL is then substantially stable in time and the problem of exposure dose variations is alleviated.

Embodiment 5

In a fifth embodiment which may be the same as the first and fourth embodiment save as described below, the source LA and the radiation system Ex, IL are rigidly fixed to two corresponding, separate support frames, each frame adjustable in position by structure of actuators. Such a modular set-up of support frames may be more practical that the use of a single support frame HP, in view of maintenance. It is then possible to adapt the sensor MM to measure the position of said two support frames with respect to the frame HO and to adapt the control structure CM to provide signals to actuators for adjusting the position of at least one of said two support frames such as to follow a movement of the frame HO. Similarly, one or more individual optical elements comprised by the radiation system Ex, IL, and traversed by the projection beam, such as for example mirrors, can be made adjustable in position by structure of corresponding optical-element position-actuators. Coefficients relating changes of position of the projection beam PB relative to the projection system PL to corresponding adjustments of position of said individual optical elements can be calculated and stored in a table. The control structure CM are then adapted to calculate, using said coefficients, the required adjustments of position of at least one of said individual optical elements and to provide corresponding signals for corresponding optical-element position-actuators, such that the position of the projection beam PB with respect to the projection system PL is substantially stable in time.

While specific embodiments of the invention have been described above, it will be appreciated that the invention may be practiced otherwise than as described. The description is not intended to limit the invention.

What is claimed is:

1. A lithographic projection apparatus comprising:
  a radiation system to supply a projection beam of radiation having a propagation direction;
  a support structure to support patterning structure, the patterning structure serving to pattern the projection beam according to a desired pattern;
  a substrate table to hold a substrate;
  a projection system to project the patterned beam onto a target portion of the substrate;
  a motion sensor constructed and arranged to measure motion of the projection beam in a direction substantially perpendicular to the propagation direction; and
  a radiation dose controller constructed and arranged to adjust a received dose of said projection beam on a target portion of the substrate in response to an output from said sensor.

2. A lithographic projection apparatus according to claim 1, wherein said controller further controls an intensity of said projection beam.

3. A lithographic projection apparatus according to claim 1, wherein said support structure and said substrate table are movable in a scanning direction that is substantially perpendicular to the propagation direction, and said sensor is adapted to measure relative motion between the projection beam and the target portion in a direction corresponding to said scanning direction.

4. A lithographic apparatus according to claim 3, wherein said controller is adapted to control the movement of said support structure and said substrate table in the scanning direction.

5. A lithographic projection apparatus according to claim 1, wherein said controller is adapted to adjust a repetition frequency of pulses of radiation comprising the projection beam.

6. A lithographic projection apparatus according to claim 1, wherein said controller is adapted to adjust a pulse energy of pulses of radiation comprising the projection beam.

7. A lithographic projection apparatus according to claim 1, wherein said controller comprises at least one actuator to adjust a position with respect to a reference point associated with the projection system of at least one component selected from the group of components comprising: the radiation system, a source for providing the projection beam to the radiation system, an optical element of the radiation system, a support frame for holding the radiation system, a support frame for holding said source, and a support frame for holding the radiation system and said source.

8. A lithographic projection apparatus according to claim 1, wherein said sensor is adapted to measure a movement with respect to a reference point associated with said projection system of at least one component selected from the group of components comprising: the radiation system, a source for providing a projection beam to the radiation system, a support frame for holding the radiation system, a support frame for holding said source, and a support frame for holding the radiation system and said source.

9. A lithographic projection apparatus according to claim 1, wherein said sensor comprises an acceleration sensor.

10. A lithographic projection apparatus according to claim 1, wherein said sensor comprises an intensity sensor to measure an intensity of said projection beam.

11. A lithographic projection apparatus according to claim 7, wherein said controller is adapted to calculate a future position of said projection beam and to output a pulse triggering signal to trigger the projection beam from a pulsed source of radiation.

12. A lithographic projection apparatus according to claim 11, wherein said apparatus comprises a data storage device connected to said sensor and said controller, to store information about the intensity and the position of said projection beam during already radiated pulses.

13. An apparatus according to claim 1, wherein the support structure comprises a mask table for holding a mask.

14. An apparatus according to claim 1, wherein the radiation system comprises a radiation source.

15. A device manufacturing method comprising:

providing a substrate that is at least partially covered by a layer of radiation-sensitive material;

providing a projection beam of radiation having a propagation direction;

patterning the projection beam with a pattern in its cross-section; and projecting the patterned beam of radiation onto a target portion of the layer of radiation-sensitive material, measuring motion of the projection beam in a direction substantially perpendicular to the propagation direction; and adjusting an intensity of said projection beam in response to said measuring.

16. A device manufactured according to the method of claim 15.

* * * * *